US012518967B1

(12) United States Patent
Schmucker et al.

(10) Patent No.: US 12,518,967 B1
(45) Date of Patent: Jan. 6, 2026

(54) AREA SELECTIVE DEPOSITION TEMPLATED BY HYDROGEN AND HALOGEN RESISTS

(71) Applicants: National Technology & Engineering Solutions of Sandia, LLC, Albuquerque, NM (US); Government of the United States as represented by the Director, National Security Agency, Fort George G. Meade, MD (US)

(72) Inventors: Scott William Schmucker, Albuquerque, NM (US); Esther Frederick, Columbia, MD (US); David R. Wheeler, Albuquerque, NM (US); Shashank Misra, Albuquerque, NM (US); Robert Butera, Prince Frederick, MD (US)

(73) Assignees: National Technology & Engineering Solutions of Sandia, LLC, Albuquerque, NM (US); Government of the United States as represented by the Director, National Security Agency, Fort George G. Meade, MD (US)

( * ) Notice: Subject to any disclaimer, the term of this patent is extended or adjusted under 35 U.S.C. 154(b) by 303 days.

(21) Appl. No.: 18/121,201

(22) Filed: Mar. 14, 2023

Related U.S. Application Data

(60) Provisional application No. 63/320,908, filed on Mar. 17, 2022, provisional application No. 63/320,933, filed on Mar. 17, 2022.

(51) Int. Cl.
*H01L 21/02* (2006.01)
*H01J 37/28* (2006.01)
*H01J 37/317* (2006.01)

(52) U.S. Cl.
CPC ........ *H01L 21/02312* (2013.01); *H01J 37/28* (2013.01); *H01J 37/3174* (2013.01);
(Continued)

(58) Field of Classification Search
CPC ...................... H01L 21/3105; H01L 21/31111
See application file for complete search history.

(56) References Cited

U.S. PATENT DOCUMENTS 7,547,648 B2    6/2009   Ruess et al.
7,799,132 B2    9/2010   Randall et al.
(Continued)

OTHER PUBLICATIONS

Ballard, J. B. et al., "Pattern transfer of hydrogen depassivation lithography patterns into silicon with atomically traceable placement and size control," J. Vac. Sci. Technol. B (2014) 32(4):041804, 7 pages.
(Continued)

*Primary Examiner* — Thomas T Pham
(74) *Attorney, Agent, or Firm* — Mark A. Dodd

(57) ABSTRACT

A process for area selective atomic layer deposition (ALD) at the near atomic scale (sub 10 nm) is disclosed. A substrate surface is cleaned and terminated with hydrogen and a pattern written in the hydrogen terminated surface by selectively depassivating the surface using scanning tunneling microscope lithography. The depassivated regions are subjected to a halogen flux with the thus passivated regions further subjected to a functionalization process creating functionalized regions. The role of hydrogen and halogen can be inverted to invert the tone of the pattern. The substrate is then subjected to the ALD process, with growth occurring only in the non-functionalized regions. The substrate may then optionally be subjected to selective etching to remove the functionalized regions and the portions of the substrate under the functionalized regions.

17 Claims, 3 Drawing Sheets

(52) U.S. Cl.
CPC .. *H01L 21/02175* (2013.01); *H01L 21/02178* (2013.01); *H01L 21/0228* (2013.01); *H01L 21/02301* (2013.01); *H01J 2237/2818* (2013.01); *H01J 2237/31754* (2013.01); *H01J 2237/31759* (2013.01); *H01J 2237/31761* (2013.01)

(56) References Cited

U.S. PATENT DOCUMENTS

| | | | |
|---|---|---|---|
| 8,580,674 | B2 | 11/2013 | Simmons et al. |
| 10,373,914 | B2 | 8/2019 | Keizer et al. |
| 10,983,142 | B2 | 4/2021 | Randall et al. |
| 2005/0223968 | A1* | 10/2005 | Randall .................. C30B 25/04 117/936 |
| 2018/0254179 | A1* | 9/2018 | Chan .................. H01L 21/76829 |
| 2022/0172991 | A1* | 6/2022 | deVilliers ........... H01L 21/0271 |

OTHER PUBLICATIONS

Bussmann, E. et al., "Atomic-precision advanced manufacturing for Si quantum computing," MRS Bulletin (2021) 46:607-615.

Chen, R. et al., "Chemistry for Positive Pattern Transfer Using Area-Selective Atomic Layer Deposition," Adv. Mater. (2006) 18:1086-1090.

Eves, B. J. et al., "Formation and reactivity of high quality halogen terminated Si(111) surfaces," Surface Science (2005) 579:L89-L96.

Ferng, S.-S. et al., "Mediation of chain reactions by propagating radicals during halogenation of H-masked Si(100): Implications for atomic-scale lithography and processing," The Journal of Chemical Physics (2009) 130:164706, 5 pages.

Ferng, S.-S. et al., "Iodine Adsorption on Arrays, Clusters, and Pairs of Reactive Sites on the Si(100) Surface," J. Phys. Chem. C (2012) 116:3091-3096.

Finstad, C. C. et al., "The mechanism of amine formation on Si(100) activated with chlorine atoms," Surface Science (2006) 600:3363-3374.

Frederick, E. et al., "The stability of Cl-, Br-, and I-passivated Si(100)-(2 x 1) in ambient environments for atomically-precise pattern preservation," J. Phys: Condens. Matter (2021) 33:444001, 10 pages.

Gwiazda, A. et al., "Simple and Versatile High Aspect Ratio Nanostructuring via Zinc Oxide Masking," Adv. Mater. Technol. (2017) 2:1700107, 8 pages.

Mackus, A. J. M. et al., "From the Bottom-Up: Toward Area-Selective Atomic Layer Deposition with High Selectivity," Chem. Mater. (2019) 31:2-12.

Silva-Quinones, D. et al., "Reaction of Hydrazine with Solution- and Vacuum-Prepared Selectively Terminated Si (100) Surfaces: Pathways to the Formation of Direct Si—N Bonds," Langmuir (2020) 36:12866-12876.

Silva-Quinones, D. et al., "Reaction of BCl3 with H- and Cl-terminated Si(100) as a pathway for selective, monolayer doping through wet chemistry," Applied Surface Science (2020) 533:146907, 8 pages.

Silva-Quinones, D. et al., "Solution Chemistry to Control Boron-Containing Monolayers on Silicon: Reactions of Boric Acid and 4-Fluorophenylboronic Acid with H- and Cl-terminated Si(100)," Langmuir (2021) 37:7194-7202.

Soria, F. A. et al., "On the Mechanism of Silicon Activation by Halogen Atoms," Langmuir (2011) 27:2613-2624.

\* cited by examiner

AREA SELECTIVE DEPOSITION TEMPLATED BY HYDROGEN AND HALOGEN RESISTS

RELATED APPLICATIONS

This application claims priority to U.S. Provisional Application No. 63/320,908, filed on Mar. 17, 2022, and entitled AREA SELECTIVE DEPOSITION TEMPLATED BY HYDROGEN AND HALOGEN RESISTS, the entirety of which is incorporated herein by reference. This application further claims priority to U.S. Provisional Application No. 63/320,933, filed on Mar. 17, 2022, and entitled Semiconductor Substrate with Atomic-Scale Pattern Transfer and Method of Area Selective Deposition Templated by Hydrogen and Halogen Resists, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a process for selectively depositing material using a hydrogen or halogen template down to the near atomic scale (sub 10 nm) and devices made by the process.

BACKGROUND

As electronic devices continue to shrink in size, traditional device processing methods are struggling to keep pace, especially with respect to developing scalable solutions capable of producing devices having dimensions that span the length of several atoms. One potential solution that has been in development over the past 30 years is a Scanning Tunneling Microscopy (STM)-based approach that utilizes the STM probe as the source of a highly focused electron beam to remove individual atoms from a monolayer resist on a silicon or germanium surface. The monolayer resist is typically a single atomic layer of hydrogen, but halogens such as chlorine, bromine, and iodine may also be used. This process exposes regions of highly reactive dangling bond sites that are then leveraged to selectively deposit material into the exposed region through reaction with gaseous molecular precursors. This method, which has been termed atomic-precision advanced manufacturing (APAM), has been utilized to achieve atomic-precision placement of single dopant qubits in silicon for quantum computing applications, atomic-scale wires, bipolar junctions and is currently the only known route to facilitate three-dimensional (3D) atomic precision fabrication of next generation silicon nanoelectronics. See, E. Bussmann et al., "Atomic-precision advanced manufacturing for Si quantum computing," MRS Bulletin, vol. 46, pp. 607-615 (2021), the contents of which are incorporated herein by reference.

While monolayer resists offer the advantage of extreme lateral precision and eliminate lithographic over-exposure, they are also highly sensitive to chemical degradation by incompatible atomic layer deposition (ALD) precursors. Prior approaches frequently pattern a hydrogen-terminated surface and use selective chemistry with increased chemical reactivity on clean silicon surfaces compared with hydrogen terminated surfaces. This contrast mechanism depends on an ultra-high vacuum (UHV) environment, as the unterminated sites are highly reactive. As such it is only compatible with a narrow range of chemistries that do not attack hydrogen terminated silicon. Further, the corresponding need for a UHV environment limits the compatibility of this atomic precision patterning capability with more well-established commercial device processing tools and is a major impediment to its adoption and use by commercial industry for next generation electronic device fabrication. Finally, these approaches provide no means to invert the contrast without excessive patterning, for example, removing the hydrogen everywhere outside of an atomic scale pattern.

Prior studies of halogen passivation and stability of surfaces in ambient environments merely demonstrated the ability to selectively deposit halogen adatoms into patterned areas on hydrogen terminated silicon, and the subsequent stability of the resulting substrates in ambient conditions. Additional studies have demonstrated the activation of silicon surfaces by chlorine atoms and have demonstrated the reactive nature of chlorine, and to a lesser extent bromine, terminated silicon surfaces to certain molecules. In particular, these prior studies demonstrated that molecules that are kinetically limited to react with a hydrogen passivated silicon surface can find enhanced reactivity with a chlorine passivated silicon surface. Other prior studies, which focused on ALD, sought to develop selective reactions for film growth into desired locations.

In summary, the need exists for a more general process that can be adapted to a wider range of chemistries that can selectively grow material down to the near atomic scale.

SUMMARY

One aspect of the present invention relates to APAM, which can pattern functionalized silicon surfaces to locally alter chemical contrast or chemical reactivity. This combination of the use of APAM patterning with selective chemical approaches to advance commercial semiconductor processing capabilities to the atomic-scale has not been previously disclosed or demonstrated. In one exemplary embodiment, APAM is used to pattern the selective deposition of zinc oxide (ZnOx) on a silicon (Si) substrate by a multi-step deposition process.

Various embodiments of the invention generally encompass a process for area-selective deposition of a thin film using a pattern that has been defined in atomic resists composed of two species from the set of hydrogen, chlorine, bromine, iodine, and fluorine. In at least one embodiment, a pattern is defined in complementary terminations on a Si surface generated by APAM where regions of the surface are terminated with bromine, and the remainder of the surface is terminated with hydrogen. In this embodiment, the bromine-terminated regions of the surface are selectively functionalized with alkene molecules in a wet chemical process. This produces a surface where some regions are alkene-terminated and other regions are hydrogen-terminated. This surface then provides chemical selectivity for an ALD process. In this embodiment, a ZnOx film may be deposited on the hydrogen-terminated regions of the surface in an iterative gas-phase process with high selectivity over the alkene-terminated (originally bromine-terminated) regions of the surface of the Si substrate.

By combining UHV-based APAM patterning methods with solution-based chemistry, ALD, and atomic layer etching (ALE) techniques, various embodiments of the present invention enable atomic-scale pattern transfer into a semiconductor substrate via reactive ion etching. Various embodiments of the present invention have produced features with lateral dimensions of tens of nanometers and depths of hundreds of nanometers. However, various embodiments of the present invention are capable of producing lateral dimensions of ~1 nanometer, while other embodiments are capable of producing etch depths on the order of microns. Various embodiments of the present invention provide for atomic precision in the lateral, or "X" and "Y" directions, and when combined with ALD or ALE, provide for true atomic precision growth of materials and films.

In at least one embodiment of the invention, a process for fabricating a device comprises the steps of providing a substrate, cleaning a surface of the substrate, terminating the surface of the substrate with hydrogen, a halogen, or a pseudo-halogen (thereby forming a terminated surface), patterning the terminated surface with hydrogen, a halogen, or a pseudo-halogen different than that used to form the terminated surface (thereby forming a patterned surface including one or more passivated regions), subjecting the surface to a functionalization process whereby each of the one or more passivated regions is terminated with covalently-bonded molecules (thereby forming one or more corresponding functionalized regions), and selectively growing a layer of material on the patterned surface (the layer of material does not grow on the one or more functionalized regions).

In various embodiments, the substrate includes a semiconductor wafer; the semiconductor wafer includes a group IV element; the step of cleaning includes sonication, wet chemical cleaning, or flash annealing; the flash annealing employs a temperature of approximately 850° C. to approximately 1250° C.; the step of terminating the surface includes subjecting the surface to a flux of atomic hydrogen, an atomic halogen, a molecular halogen, a molecular pseudo-halogen, or a wet chemical solution that terminates the surface in hydrogen, halogen, or pseudo-halogen; and a temperature of the substrate during the step of terminating is between approximately 20° C. and approximately 450° C.

In other embodiments, the step of patterning includes depassivating one or more regions of the terminated surface; the step of patterning employs STM lithography, e-beam lithography, photolithography, or ion-beam lithography; the step of patterning further includes subjecting the depassivated one or more regions of the terminated surface to a flux of atomic hydrogen, an atomic halogen, a molecular halogen, or a molecular pseudo-halogen different than that used to form the terminated surface (thereby creating the one or more passivated regions); halogen includes one of Br, Cl, I or F; the functionalization process includes a solvothermal chemistry process, a wet chemistry-based process, or a gas chemistry-based process; and the functionalization process employs a mesitylene solution containing 1-dodecene.

In still other embodiments, the step of selectively growing employs an atomic layer deposition process; the layer of material includes a metal or an oxide; the oxide includes zinc oxide or aluminum oxide; the process further comprises a step of annealing the substrate with the patterned surface including one or more passivated regions after the step of patterning the terminated surface; the process further comprises a step of annealing the substrate with the layer of material after the step of selectively growing; the process further comprises a step of selectively etching the one or more functionalized regions after the step of selectively growing (thereby creating one or more corresponding exposed regions of the substrate); and the step of selectively etching further comprises selectively etching the one or more exposed regions of the substrate.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1A:
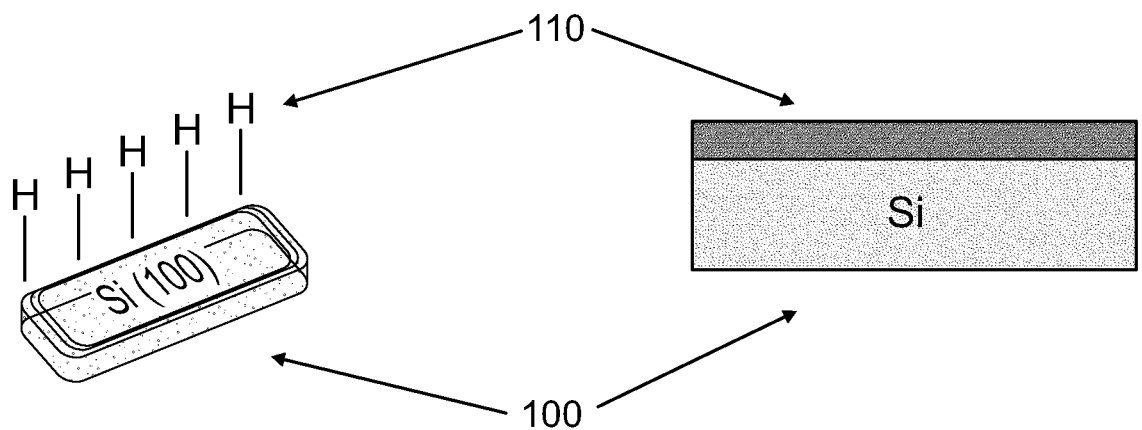
FIGS. 1A-1E illustrate three-dimensional (3D) and cross-sectional views of an atomic precision advanced manufacturing (APAM)-based process in accordance with one or more embodiments of the present invention.
Figure 1B:
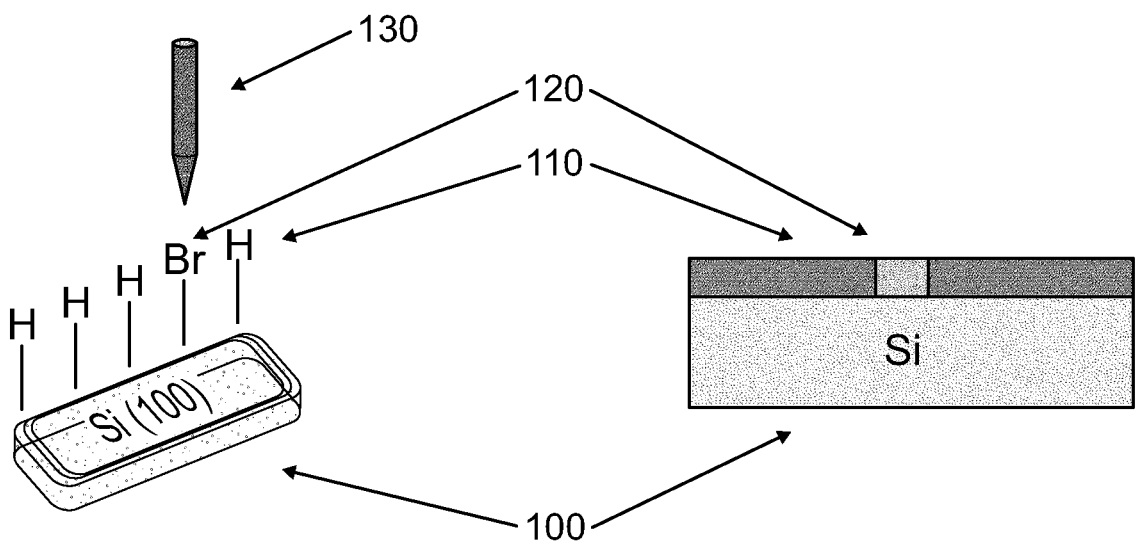
Figure 1C:
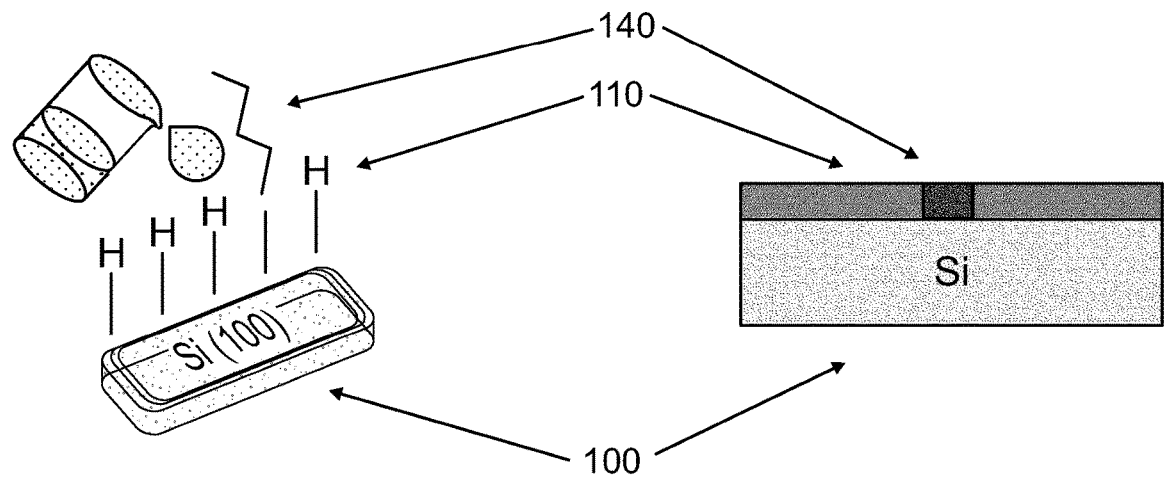
Figure 1D:
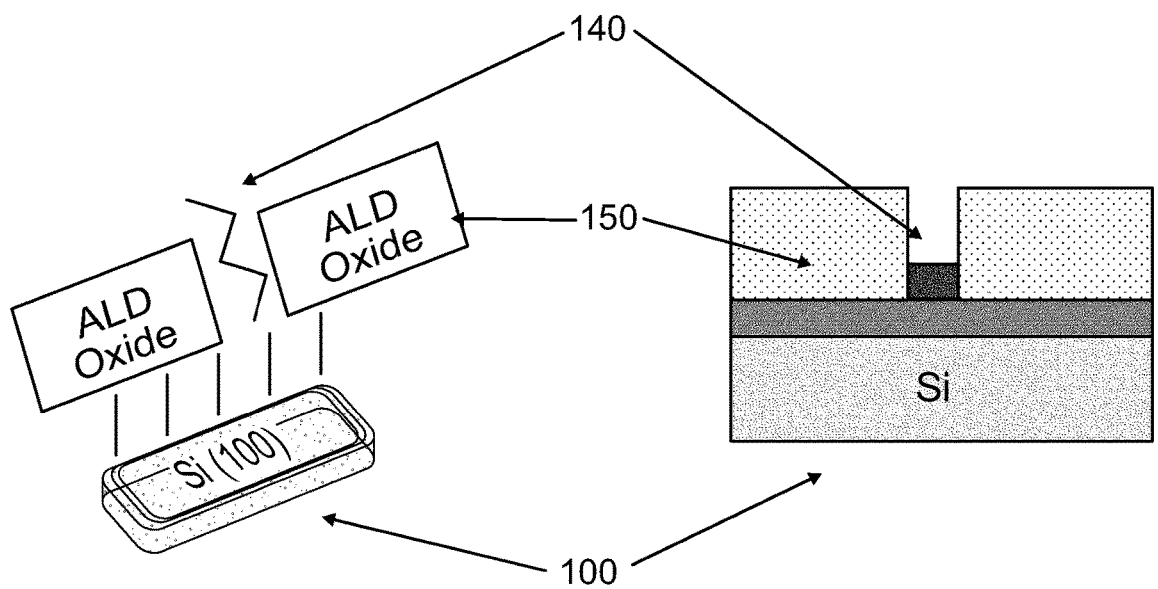
Figure 1E:
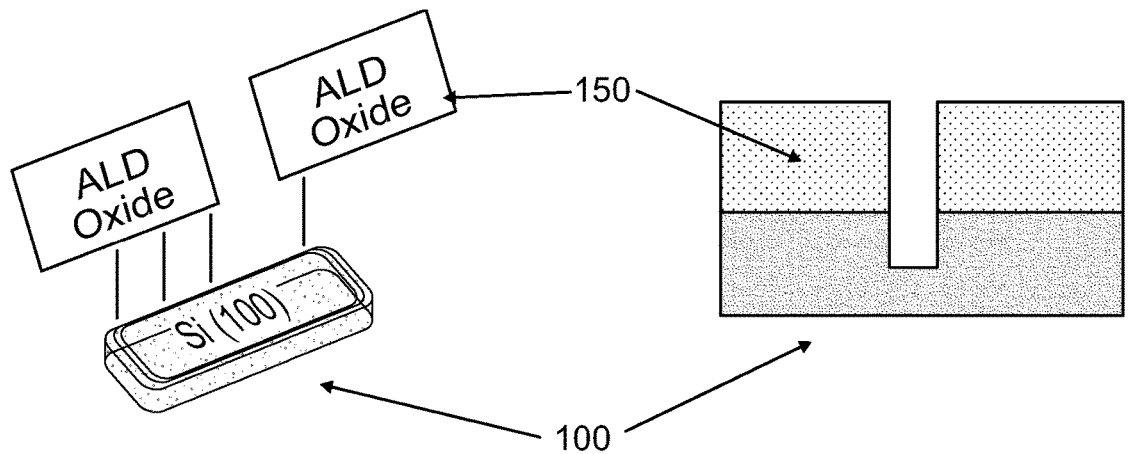

FIGS. 1A-1E illustrate the atomic-precision advanced manufacturing (APAM)-based process in accordance with at least one embodiment. As illustrated in FIG. 1A, the process begins by terminating a cleaned silicon (Si) (or other group IV) substrate 100 with hydrogen (H), with the H acting as an atomic resist layer 110 for subsequent steps. As illustrated in FIG. 1B, a scanning tunneling microscope (STM) tip 130 is used to pattern the atomic resist layer 110 by depassivating and subsequently selectively replacing portions of the atomic resist layer 110 with a halogen, for example, bromine (Br), chlorine (Cl), iodine (I), or fluorine (F), or a pseudo-halogen, thereby creating a halogenated region 120. While the use of STM lithography is described as the means for patterning the atomic resist layer 110, the invention is not so limited. For example, in other embodiments, the atomic resist layer 110 may be patterned using electrons (e.g., e-beam lithography), photons (e.g., photolithography), ions (e.g., ion-beam lithography), or other external stimulus to remove individual hydrogen atoms. The dimensions of an individual halogenated region 120 may range from angstroms to microns. FIG. 1C illustrates the patterned wafer being subjected to an alkene functionalization process in which the halogenated region 120 of the patterned wafer becomes terminated with an alkene, thereby creating an alkene-terminated region 140. While alkenes may be used, any molecule capable of a covalent reaction (bond) with the surface of the substrate 100 may be used, for example, a molecule with a double or triple bond. Thus, the alkene-terminated region 140 may more generally be termed a functionalized region. As illustrated in FIG. 1D, the patterned wafer is subjected to an atomic layer deposition (ALD) process in which an oxide layer 150, for example, a zinc oxide (ZnOx) or aluminum oxide (AlOx) layer, is grown. The oxide layer 150 grows uniformly across the entire substrate 100 except in the alkene-terminated region 140, which selectively blocks growth of the oxide layer 150. Thus, the ALD process is area selective (AS), which may be termed AS-ALD. FIG. 1E illustrates the result of subjecting the patterned and ALD grown wafer to an optional selective etching process in which the alkene-terminated region 140 is removed as well as a portion of the substrate 100 directly under the alkene-terminated region 140.

Figure 2:
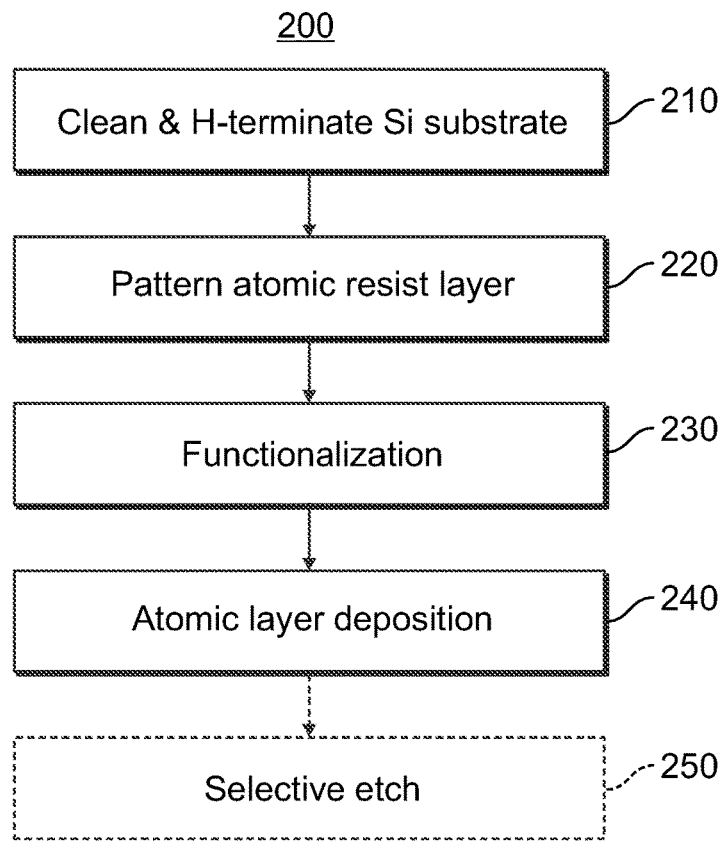
FIG. 2 illustrates a flow chart corresponding to an APAM-based process in accordance with one or more embodiments of the present invention.

FIG. 2 illustrates a flow chart corresponding to a more general APAM-based process 200 than that illustrated in FIGS. 1A-1E. In step 210, a group IV substrate is cleaned, and its surface passivated with either H or a halogen (Cl, Br, I, or F), thereby creating an atomic resist layer. In step 220, the atomic resist layer is patterned using, for example, an STM tip to selectively replace portions of the H (or halogen) resist layer with halogenated (or hydrogenated) regions. In step 230, the patterned wafer from step 220 is subjected to a functionalization process that converts the halogenated (or hydrogenated) regions into functionalized regions. In step 240, an AS-ALD process forms either an oxide or metallic layer on the surface of the Si substrate except in the functionalized regions. In step 250, the patterned and AS-ALD grown wafer is optionally etched to remove the functionalized regions and some of the Si wafer underlying the functionalized regions.

In step 210, the group IV wafer may be cleaned, for example, by sonication in acetone, methanol, and isopropanol, and loaded into an ultra-high vacuum (UHV) chamber. Other wet chemical cleaning methods may alternatively be employed in step 210, including, for example, the so-called "RCA" cleaning procedure. A clean Si(100)–(2×1), or other desired orientation, surface may be prepared, for example, by flash annealing the Si wafer to approximately 850 to 1250° C. The H-terminated surface is prepared by exposing the cleaned Si surfaces to a flux of atomic H generated by a H atom beam source with the substrate held at a temperature of approximately 20° C. to 450° C. The surface may alternately be halogen-terminated instead of H-terminated in step 210 using the process described below. In other embodiments, the cleaned Si surfaces may be exposed to a wet chemical process that similarly terminates the surface. For example, the cleaned Si surfaces may be exposed to a HF and $NH_4F$ solution to hydrogen terminate the cleaned Si surfaces, while alternative wet chemical solutions may be used to halogen terminate the cleaned Si surfaces.

In step 220, the Si wafer with its terminated surface is selectively depassivated using STM lithography to remove the atomic resist and thereby create the desired depassivated regions. Feature sizes, using, for example, STM lithography, may be as small as the near atomic scale, i.e., less than 10 nm. Either positive (electron injection) or negative (hole injection) sample biases may be used to facilitate the removal of hydrogen (or halogen) atoms in the atomic resist. The Si wafer is then exposed to a $Br_2$, a $Cl_2$, an $I_2$, a $F_2$, or a pseudo-halogen (e.g., cyanogen $(CN)_2$, thiocyanogen $(SCN)_2$, hydrogen peroxide $H_2O_2$, and dicobalt-octacarbonyl $Co_2(CO)_8$) flux to convert the depassivated regions into halogenated passivated regions. As described above, the processes in step 210 and 220 may be inverted—with a halogen resist in the field, and a hydrogen resist being applied to the patterned regions. In other embodiments, two different halogen species may be used in the field and patterned regions. The Si wafer is held at a temperature between approximately 200° C. and approximately 250° C. in UHV to minimize water contamination and prevent accumulation of inserted halogen species during its exposure to the molecular halogen flux. $Cl_2$, $Br_2$, $I_2$, and $F_2$ may, for example, be generated from a solid-state, electrochemical cell consisting of $CaF_2$ or AgX (X=Cl, Br, or I) doped respectively with 5 wt % of the corresponding cadmium halide for $Cl_2$ and $Br_2$, while RbI was used for $I_2$. After exposure to the molecular halogen flux, the patterned Si wafer is further annealed at, for example, 200° C. for I, 370° C. for Br, or 425° C. for Cl, to remove any physisorbed halogens. These annealing temperatures are low enough to prevent activation of surface etching and roughening processes. For $Cl_2$ halogenated regions, the regions are reactive in an air atmosphere, and thus must be protected, for example, by using $N_2$ ambient glove boxes. For additional information regarding the stability of the halogenated regions see E. Frederick et al., "The stability of Cl—, Br—, and I-passivated Si(100)-(2×1) in ambient environments for atomically-precise pattern preservation," Journal of Physics: Condensed Matter, vol. 33, art. no. 444001 (2021), the contents of which are incorporated herein by reference.

To react the hydrogen and halogen resists with alkenes as part of step 230, the patterned Si wafer is removed from the UHV chamber and placed, for example, in a Schlenk flask for reaction under $N_2$. The patterned Si wafer may, for example, be reacted with ~2 mL of a 0.4M 1-dodecene in mesitylene solution for approximately 4 hours at a temperature of 100° C. in a so-called "solvothermal chemistry" process. (At temperatures of less than 100° C., ZnOx films were formed on both the halogenated regions and the hydrogenated regions in step 240.) More generally, the patterned Si wafer may be reacted with a solution consisting of an alkane, alkene, or alkyne dissolved in a solvent. While this embodiment employs the solvothermal chemistry process, other embodiments are not so limited. For example, in other embodiments, the functionalization of the patterned Si wafer may employ a gas-based reaction, i.e., a gas chemistry-based process, as opposed to the wet chemistry-based process employed in the solvothermal chemistry approach. After the reaction, the patterned Si wafer is cleaned, for example, with multiple mesitylene rinses, sonicated in mesitylene, and then a final mesitylene rinse immediately followed by drying with $N_2$. The organic (alkane, alkene, or alkyne) functionalized pattern, i.e., the functionalized region, serves as a growth promoter or inhibitor, depending upon the functionalization, for further processing in a standard ALD chamber, corresponding to step 240.

A ZnOx film is deposited using AS-ALD in step 240. Prior to deposition all heaters were pre-heated to 150° C. overnight. The chamber was pre-conditioned with 100 cycles Trimethyl aluminum/$H_2O$ and 250 cycles diethyl zinc (DEZ)/$H_2O$ to prevent incidental contamination. The patterned Si wafer is loaded into the ALD chamber, on a larger Si sacrificial substrate to further prevent contamination from the ALD platform. The chamber was pumped down and the temperature re-stabilized before beginning the deposition run. The ZnOx film is deposited using 200 cycles with a background chamber pressure during the process of approximately 0.4 Torr. Each cycle consisted of a 0.015 second $H_2O$ pulse at approximately 0.7 Torr followed by a 20 second $N_2$ purge, and a 0.015 second DEZ pulse at approximately 0.7 Torr followed by another 20 second $N_2$ purge. After the 200 cycles completed, the patterned and now AS-ALD grown Si wafer is removed from the growth chamber. This ALD process produces a 12-15 nanometer thick film of ZnOx on the hydrogen passivated regions of the sample, but not on the functionalized regions. As will be appreciated by one of skill, the actual number of cycles is a function of the desired thickness of the ZnOx film.

In other embodiments, the organic functionalization can be tailored to any desired reaction such that the film of a desired material is grown on either the functionalized region or the surrounding non-functionalized resist region. For example, oxide or metal films from organometallic precursors may be deposited in step 240. This area-selective deposition can be executed in either tone. For example, if the field is hydrogen (halogen) terminated and the pattern is halogen (hydrogen) terminated, the tone is negative (positive).

In other embodiments, the AS-ALD grown Si wafer may undergo an optional annealing process. This optional annealing process improves the crystallinity of the AS-ALD grown film, i.e., the ZnOx film in the described process.

In step 250, the patterned and AS-ALD grown wafer is optionally subjected to one or more etching process. In certain embodiments, the organic (alkane, alkene, or alkyne)-terminated functionalized regions are removed using a reactive ion etch. In certain embodiments, a portion of the group IV wafer underlying the functionalized regions may also be removed using an etch process. This optional etch step 250 can be of either tone depending on the tone, positive or negative, of the oxide/metal deposition in step 240.

In at least one embodiment of the present invention, reactive ion etching using standard procedures are used employing $SF_6$ and $O_2$ (gas stabilization: 17 sccm $SF_6$+8 sccm $O_2$, 10 mTorr, 0 W, 30 sec; etch: 17 sccm $SF_6$+8 sccm $O_2$, 4 mTorr, 90 W, 15-20 min) to transfer the original pattern defined by STM lithography into the group IV wafer to depths of greater than 100 nm. In a similar manner, other reactive ion or neutral gaseous species can be used to etch the group IV wafer, and thereby transfer the patterns into the group IV wafer.

The various embodiments of the present invention as described combine APAM methods with traditional semiconductor fabrication processes. The novelty is in the compatibility of the two starkly different approaches, resulting in a pathway towards scalability for APAM methods. The various embodiments as described utilize the difference in reactivity between two distinct single atomic layers of adatoms-hydrogen and halogen—to selectively deposit desired material into atomically precise areas. This approach demonstrates that APAM methods can be combined with standard processing tools and are not inherently limited to UHV environments. The limitations of UHV environments have significantly hindered the types of materials that could be used and realized. This approach has the potential to enable new materials and devices to be realized.

Various embodiments of the present invention utilize an intermediary pattern passivation layer that serves two purposes: First, this intermediary pattern passivation layer leverages the selective reaction of an organic (alkane, alkene, or alkyne) self-assembled monolayer with halogen passivated silicon with respect to hydrogen passivated silicon. This reaction is in stark contrast to the well-known hydrosilylation reactions that are used to react similar molecules with hydrogen passivated silicon surfaces. Of importance here is the optimization of the reaction conditions, namely a reaction temperature of 100° C., to activate (deactivate) the organic reaction with the halogen (hydrogen) passivated surface. Various embodiments have demonstrated the capability to selectively grow a thin film to be used as an etch mask. Second, this part of the process preserves the near atomic scale dimensions of the pattern, which are maintained even after a film having a thickness of tens of nanometers is grown. This far exceeds the current state of the art in both the size of the pattern and the selectivity in the deposition.

Various embodiments of the present invention have demonstrated the transfer of a near atomic scale pattern through a selectively grown etch mask by conventional semiconductor etch processes. This part of the process provides improvements in the selectivity of the etch, the depth of the etch, and the maintenance of the near atomic scale dimensions through the pattern transfer process.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A process for fabricating a device, the process comprising the steps of:
   providing a substrate;
   cleaning a surface of the substrate;
   terminating the surface of the substrate with one of hydrogen, a halogen, or a pseudo-halogen to thereby form a terminated surface, the halogen not including Br;
   patterning the terminated surface, the step of patterning including:
      depassivating one or more regions of the terminated surface; and
      subjecting the thus depassivated one or more regions of the terminated surface to a flux of Br to thereby create one or more passivated regions;
   subjecting the terminated surface and the one or more passivated regions to a functionalization process whereby each of the one or more passivated regions is terminated with covalently-bonded molecules to thereby form one or more corresponding functionalized regions; and
   selectively growing a layer of material on the terminated surface, wherein the layer of material does not grow on the one or more functionalized regions.

2. The process of claim 1, wherein the substrate includes a semiconductor wafer.

3. The process of claim 2, wherein the semiconductor wafer includes a group IV element.

4. The process of claim 1, wherein the step of cleaning includes at least one of sonication, wet chemical cleaning, or flash annealing.

5. The process of claim 4, wherein the flash annealing employs a temperature of approximately 850° C. to approximately 1250° C.

6. The process of claim 1, wherein the step of terminating the surface includes subjecting the surface to:
   a flux of one of atomic hydrogen, an atomic halogen, a molecular halogen, or a molecular pseudo-halogen; or
   a wet chemical solution that terminates the surface in hydrogen, halogen, or pseudo-halogen.

7. The process of claim 6, wherein a temperature of the substrate during the step of terminating is between approximately 20° C. and approximately 450° C.

8. The process of claim 1, wherein the step of patterning employs one of STM lithography, e-beam lithography, photolithography, or ion-beam lithography.

9. The process of claim 1, wherein the functionalization process includes one of a solvothermal chemistry process, a wet chemistry-based process, or a gas chemistry-based process.

10. A process for fabricating a device, the process comprising the steps of:
    providing a substrate;
    cleaning a surface of the substrate;

terminating the surface of the substrate with one of hydrogen, a halogen, or a pseudo-halogen to thereby form a terminated surface, the halogen not including Br;

patterning the terminated surface with Br to thereby form one or more passivated regions;

subjecting the terminated surface and the one or more passivated regions to a functionalization process whereby each of the one or more passivated regions is terminated with covalently-bonded molecules to thereby form one or more corresponding functionalized regions the functionalization process employing a mesitylene solution including 1-dodecene; and selectively growing a layer of material on the terminated surface, wherein the layer of material does not grow on the one or more functionalized regions.

11. The process of claim 1, wherein the step of selectively growing employs an atomic layer deposition process.

12. The process of claim 1, wherein the layer of material includes a metal or an oxide.

13. The process of claim 12, wherein the oxide includes zinc oxide or aluminum oxide.

14. The process of claim 1 further comprising a step of annealing the substrate with the one or more passivated regions after the step of patterning the terminated surface.

15. The process of claim 1 further comprising a step of annealing the substrate with the layer of material after the step of selectively growing.

16. The process of claim 1 further comprising a step of selectively etching the one or more functionalized regions after the step of selectively growing, to thereby create one or more corresponding exposed regions of the substrate.

17. The process of claim 16, wherein the step of selectively etching further comprises selectively etching the one or more exposed regions of the substrate.

* * * * *